United States Patent
Ahn et al.

(10) Patent No.: US 12,412,615 B2
(45) Date of Patent: Sep. 9, 2025

(54) COUNTER-BASED SELECTIVE ROW HAMMER REFRESH APPARATUS AND METHOD FOR ROW HAMMER PREVENTION

(71) Applicant: SEOUL NATIONAL UNIVERSITY R&DB FOUNDATION, Seoul (KR)

(72) Inventors: Jung Ho Ahn, Seoul (KR); Micheal Jae Min Kim, Seongnam-si (KR); Nam Hoon Kim, Seoul (KR); Jae Hyun Park, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 170 days.

(21) Appl. No.: 18/268,651

(22) PCT Filed: Jan. 11, 2021

(86) PCT No.: PCT/KR2021/000326
§ 371 (c)(1),
(2) Date: Aug. 21, 2023

(87) PCT Pub. No.: WO2022/139057
PCT Pub. Date: Jun. 30, 2022

(65) Prior Publication Data
US 2024/0079042 A1 Mar. 7, 2024

(30) Foreign Application Priority Data
Dec. 21, 2020 (KR) .................. 10-2020-0180121

(51) Int. Cl.
*G11C 11/406* (2006.01)
(52) U.S. Cl.
CPC ................ *G11C 11/406* (2013.01)

(58) Field of Classification Search
CPC ............ G11C 11/406; G11C 11/40603; G11C 11/40611; G06F 13/1636; G06F 3/06
(Continued)

(56) References Cited

U.S. PATENT DOCUMENTS 12,119,404 B2 * 10/2024 Wang ................ H01L 29/66545
2019/0066759 A1 2/2019 Nale
(Continued)

FOREIGN PATENT DOCUMENTS

| KR | 10-1731508 | 5/2017 |
| KR | 10-2019-0033387 | 3/2019 |
| KR | 10-2019-0135736 | 12/2019 |

OTHER PUBLICATIONS

Park, Yeonhong, et al. "Graphene: Strong yet lightweight row hammer protection." 2020 53rd Annual IEEE/ACM International Symposium on Microarchitecture (Micro). IEEE, (Oct. 17-21, 2020). 13 pages.

*Primary Examiner* — Amir Zarabian
(74) *Attorney, Agent, or Firm* — LEX IP MEISTER, PLLC

(57) ABSTRACT

Proposed are counter-based selective row hammer refresh apparatus and method for row hammer prevention and, more particularly, proposed are an apparatus and a method for reducing energy consumption of dynamic random access memory (DRAM) by improving counter-based algorithms for solving a row hammer problem when applying a refresh management (RFM) command that is a new command applied to the latest DRAM standards, such as DDR5, LPDDR5, and the like.

6 Claims, 10 Drawing Sheets

(58) Field of Classification Search
USPC .......................................................... 365/222
See application file for complete search history.

(56) References Cited

U.S. PATENT DOCUMENTS

| | | | |
|---|---|---|---|
| 2024/0062800 A1* | 2/2024 | Van Der Veen | G06F 13/1636 |
| 2024/0112723 A1* | 4/2024 | Agarwal | G11C 11/406 |
| 2024/0185905 A1* | 6/2024 | Liu | G11C 11/4072 |

* cited by examiner

COUNTER-BASED SELECTIVE ROW HAMMER REFRESH APPARATUS AND METHOD FOR ROW HAMMER PREVENTION

TECHNICAL FIELD

The present disclosure relates to counter-based selective row hammer refresh apparatus and method for row hammer prevention and, more particularly, to an apparatus and a method for reducing energy consumption of dynamic random access memory (DRAM) by improving counter-based algorithms for solving a row hammer problem when applying a refresh management (RFM) command that is a new command applied to the latest DRAM standards, such as DDR5 and LPDDR5, and the like.

BACKGROUND ART

Row hammer is a phenomenon in which, when one DRAM row in DRAM is continuously accessed and operated, data of rows physically adjacent to the corresponding row are unintentionally changed.

In order to solve the row hammer, a refresh operation is performed in the DRAM to restore data to its original state. A predetermined period of time is required to be given to the DRAM for the refresh operation.

As a row hammer phenomenon is getting worse due to recent improvement in memory density, more time is required to be given to DRAM.

A row hammer prevention scheme is a technology that refreshes a dangerous row at an appropriate time according to a predetermined algorithm or methodology to prevent a row hammer phenomenon. A module for the row hammer prevention scheme can be located inside a DRAM chip, a register clock driver (RCD), or a memory controller, or the like.

Refresh management (RFM) is an interface that gives DRAM additional time to prevent row hammer in a situation in which a row hammer phenomenon is intensified. The memory controller counts the number of activation (ACT) commands for each DRAM bank and sends a refresh management command to DRAM at a specific number of the activation commands, and at this time, the DRAM can perform necessary refresh according to an appropriate row hammer prevention scheme. The refresh management is being applied to LPDDR5 and DDR5.

However, in the row hammer prevention scheme by the existing refresh management such as US Patent Application Publication No. 2019-0228813, a DRAM device may preset the specific number of activation commands to send refresh management command, but the memory controller continuously sends the refresh management command without specific information about the state of the row hammer prevention scheme existing in DRAM, and when no special measures are taken, the DRAM device performs the row hammer refresh each time, which causes the problem that computer system performance is degraded and additional energy is consumed.

DOCUMENTS OF PRIOR ART

Patent Document: US Patent Application Publication No. 2019-0228813 (published on Jul. 25, 2019)
Non-Patent Document 1: Y. Kim., et al. "Flipping Bits in Memory Without Accessing Them: An Experimental Study of DRAM Disturbance Errors," 2014 ACM/IEEE 41st International Symposium on Computer Architecture (ISCA), 2014.
Non-Patent Document 2: M. Son., et al. "Making DRAM Stronger Against Row Hammering," in Proceedings of the 54th Annual Design Automation Conference, 2017.
Non-Patent Document 3: J. M. You., et al. "MRLoc: Mitigating Row-hammering Based on Memory Locality," in Proceedings of the 56th Annual Design Automation Conference, 2019.
Non-Patent Document 4: E. Lee., et al. "TWiCe: Preventing Row-hammering by Exploiting Time Window Counters," 2019 ACM/IEEE 46th Annual International Symposium on Computer Architecture (ISCA), 2019.
Non-Patent Document 5: Y. Park., et al. "Graphene: Strong yet Lightweight Row Hammer Protection," 2020 53rd Annual IEEE/ACM International Symposium on Microarchitecture, 2020.
Non-Patent Document 6: S. M. Seyedzadeh., et al. "Mitigating Wordline Crosstalk Using Adaptive Trees of Counters," 2018 ACM/IEEE 45th Annual International Symposium on Computer Architecture (ISCA), 2018.
Non-Patent Document 7: I. Kang., et al. "CAT-TWO: Counter-Based Adaptive Tree, Time Window Optimized for DRAM Row-Hammer Prevention," IEEE Access, 2020.

DISCLOSURE

Technical Problem

An objective of the present disclosure made to solve the above problems is to propose counter-based selective row hammer refresh apparatus and method for row hammer prevention which improves energy efficiency by determining whether a refresh is required at each refresh management command and performing refresh only when necessary.

Technical Solution

In order to accomplish the above objectives, a counter-based selective row hammer refresh apparatus for row hammer prevention of the present disclosure includes: a memory controller comprising a plurality of first counters issued per DRAM bank, subbank, or bundle of multiple DRAM banks (hereinafter, referred to as a DRAM bank), an ACT command generation part configured to transmit an activation (ACT) command, which causes a specific DRAM bank to activate, to a DRAM, and a refresh management command generation part which increases a first counter value of the specific DRAM bank, which is activated, by 1, and sends a refresh management (RFM) command to perform row hammer refresh (RH refresh) in the DRAM bank to a row hammer prevention control part of the DRAM when the first counter value reaches an rolling accumulated activate initial management threshold (RAAIMT) received previously from the DRAM; and the DRAM comprising a second counter which is present in the DRAM and counts a number of activations (ACT) of the DRAM bank, and the row hammer prevention control part which performs a deterministic RH prevention algorithm and when receiving the refresh management command, compares a value of the second counter counting the number of activations (ACT) of the DRAM bank until the reception of the refresh management command with a preset reference value, wherein when the second counter value is smaller than the reference value, the row hammer refresh is not performed in the DRAM bank, but when the second counter value is greater than the reference value, the row hammer refresh is performed in the DRAM bank, and then a value of the second counter of a row of the DRAM bank in which the row hammer refresh is performed is initialized to 0 or a specific value.

In addition, the second counter may be located in the DRAM, a register clock driver (RCD), or a logic die.

A counter-based selective row hammer refresh method for row hammer prevention of the present disclosure includes: (a) a step at which the memory controller transmits the activation (ACT) command to perform activation of the specific DRAM bank to the DRAM and increases the value of the first counter of the specific DRAM bank by 1 among the plurality of first counters issued per DRAM bank, subbank, or bundle of multiple DRAM banks (hereinafter, referred to as a DRAM bank) present in the memory controller; (b) a step at which the memory controller sends the refresh management (RFM) command to perform the row hammer refresh (RH refresh) in the DRAM bank to the row hammer prevention control part of the DRAM performing the deterministic RH prevention algorithm when the first counter value reaches the rolling accumulated activate initial management threshold (RAAIMT) received previously from the DRAM; (c) a step at which when receiving the refresh management command, the row hammer prevention control part of the DRAM compares the value of the second counter of the DRAM counting the number of activations of the DRAM bank until the reception of the refresh management command with the preset reference value; and (d) a step at which as a result of the comparison by the row hammer prevention control part of the DRAM at the step (c), when the second counter value is smaller than the reference value, the row hammer refresh is not performed in the DRAM bank, but when the second counter value is greater than the reference value, the row hammer refresh is performed in the DRAM bank, and then the value of the second counter of the row of the DRAM bank in which the row hammer refresh is performed is initialized to 0 or a specific value.

In addition, the deterministic RH prevention algorithm, which is a counter-based row hammer prevention algorithm, may include TWiCe, Graphene, CBT, and CAT-TWO algorithms.

Furthermore, when the row hammer refresh is performed at the step (d), in a case of each of the TWiCe, CBT, and CAT-TWO, the value of the second counter of the row in which the row hammer refresh is performed may be initialized to 0, and in a case of the Graphene, the value of the second counter of the row in which the row hammer refresh is performed may be initialized to a value of a spillover counter.

In addition, when the deterministic RH prevention algorithm is the Graphene algorithm, the reference value may be a relative value that is a difference between a maximum value of second counter values and the spillover counter value (a minimum value) of each DRAM bank.

Advantageous Effects

According to the counter-based selective row hammer refresh apparatus and method for row hammer prevention of the present disclosure, energy efficiency can be improved by determining whether a refresh is required at each refresh management command and performing refresh only when necessary.

When the number of refreshes is reduced in the row hammer prevention scheme, a great advantage can be obtained in terms of energy, and this is because refresh, which activates and precharges (PRE) two or more DRAM rows, causes a significant portion of the energy consumption of the row hammer prevention scheme.

BEST MODE

Figure 1:
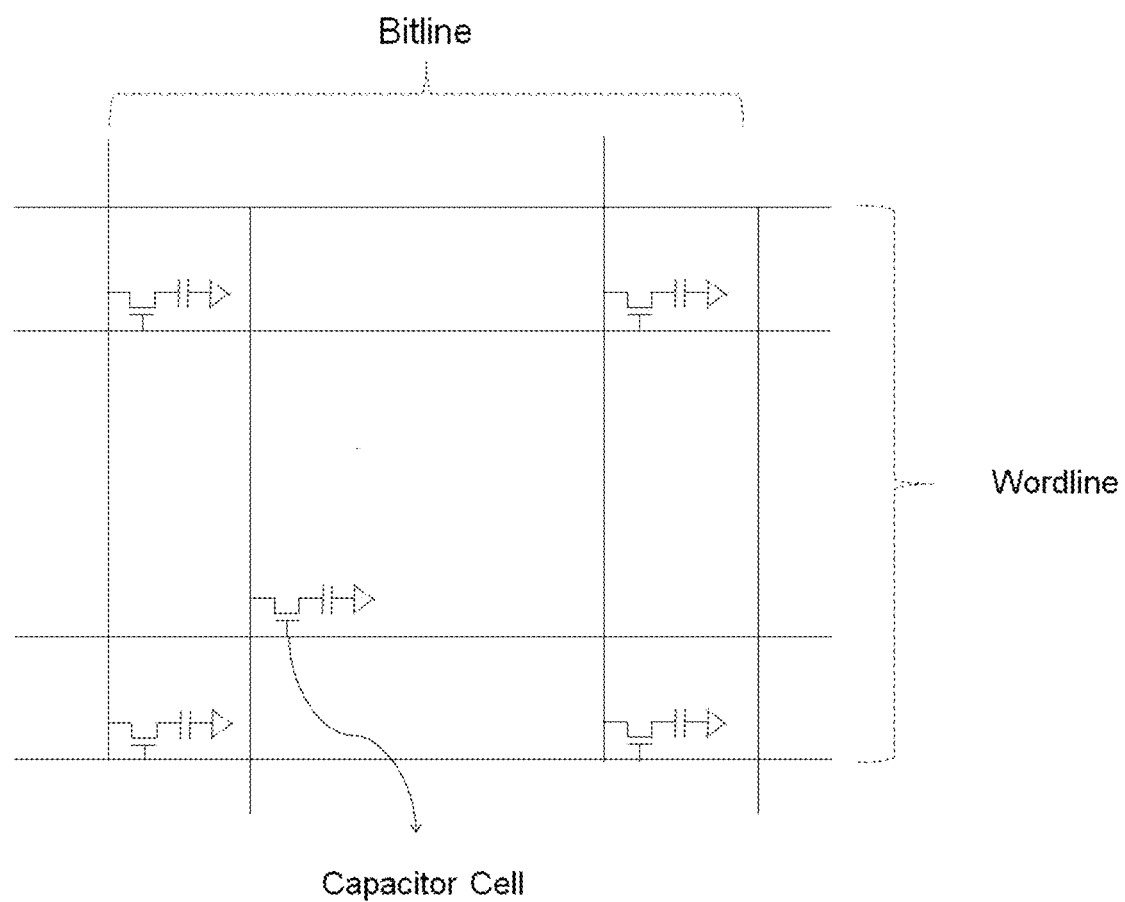
FIG. 1 is a structural diagram of a part in which information of DRAM is stored.

Prior to a detailed description of an embodiment of the present disclosure, terms and background knowledge related to DRAM, a memory controller, and a row hammer prevention scheme are first described to aid understanding.

TABLE 1

| Term | Definition |
| --- | --- |
| Memory controller (MC) | A memory controller controls memory according to memory requests from a processor (e.g., CPU or GPU). Generally, the memory controller is mounted in the processor. |
| Memory request | Memory request refers to a processor requesting reading or writing data at a specific address. |
| Row buffer | A part that buffers a data in DRAM device (a chip or die) in a unit of one row (page). There is one row buffer per DRAM bank. |
| Activation | A DRAM operation which drives the specified wordline to connect the DRAM cells to the bitline so that specified DRAM row is buffered in a row buffer. |
| ACT command | A command sent by a memory controller that causes the DRAM to perform activation. |
| Precharge | DRAM operation that changes the voltage of the bitline to half the Vdd and invalidates a row buffer. |
| PRE command | A command sent by a memory controller that causes the DRAM to be precharged. |
| Channel | A channel refers to a unit that connects MC and DRAM devices. One MC can be connected to the DRAM devices through one or more channels, and one channel can be connected to multiple DIMMs (dual in-line memory modules). |

TABLE 1-continued

| Term | Definition |
|---|---|
| Rank | A unit of DRAM. One DIMM consists of one or a small number of ranks. |
| Bank | A unit of DRAM. One rank is composed of multiple banks. Each bank can operate independently, but shares is data path and a control path connected to the outside of the device with other banks in the rank. One bank consists of multiple rows. |
| DRAM chip | A rank is constructed with multiple DRAM chips for high bandwidth and capacity. |
| Refresh | DRAM operation that rewrites the value of a cell to an original 0 or 1. |
| Normal refresh (auto refresh) | Operation of periodically sending a refresh command from a memory controller to DRAM. |
| Retention time | The amount of time for which a cell can maintain a stored value without refreshing. Due to the passive nature of DRAM cells, which are the basic storage units of DRAM, charge stored in the capacitor of the cells leaks over time and value of the cells is lost. |
| Refresh command (REF command) | A command from the memory controller to DRAM so that the DRAM performs a normal refresh by receiving time equal to tRFC. |
| Refresh interval time (tREFI) | A time interval at which a memory controller sends an REF command. |
| Refresh cycle time (tRFC) | Time given to DRAM when a memory controller sends a REF command to DRAM. |
| Row hammer (RH) | A phenomenon in which a row (an aggressor row) is frequently activated, a physically adjacent row (a victim row) is undesirably affected, resulting in a bit flip. |
| Victim row | A row that is adjacent to a frequently activated row and is at the risk of a bit flip. |
| Aggressor row | A row that is frequently activated. |
| Row hammer (RH) threshold (Nth) | From the viewpoint of a victim row, when the number of times at which an adjacent aggressor row is activated without any refresh exceeds a predetermined threshold, a bit flip may occur. This threshold is defined as a Row hammer threshold (Nth). |
| Row hammer refresh | Refreshing a victim row, apart from normal refresh |
| Row hammer prevention scheme | A general term for all schemes to prevent row hammer through row hammer refresh |
| Time margin | In the present disclosure, a memory controller provides a predetermined amount of time (time margin) during which no other commands are issued to DRAM so that the DRAM can prevent row hammer on its own. |
| RH prevention algorithm | Detailed method and algorithm of an RH prevention scheme |
| Probabilistic RH prevention algorithm | A random target is selected according to a predetermined methodology, and row hammer refresh is performed on the target. It is generally impossible to completely prevent row hammer with a probabilistic method. |
| Deterministic counter-based RH prevention algorithm | A target with high activation is selected according to a predetermined methodology, and a row hammer refresh is performed on the target. When selecting a target, the target is selected on the basis of a counter that counts the number of activations. |
| Refresh management (RFM) command | A command sent from a memory controller to DRAM, and during time given through this command, DRAM can perform row hammer refresh. |
| Refresh Management time (tRFM) | Time given to DRAM whenever a refresh management command is sent. |
| Rolling accumulated ACT (RAA) counter | A counter that exists per bank (or a subbank) in a memory controller. The number of activations that occur per bank is counted, and is decremented each time at which a refresh management command or a refresh command occurs. |
| RAA initial management threshold | The number of activations that is a criterion for sending a refresh management command in DDR5 and LPDDR5 specifications. When the value of an RAA counter reaches RAAIMT, the refresh management command is sent. |
| #ofTableEntry | The number of entries in a counter table of counter-based algorithms. |
| Adaptive row hammer refresh reference value (SelectiveParam) | Parameter value that is reference for selective row hammer refresh. |
| MaxActs | The maximum number of activations that may occur during the initialization cycle of a table in a counter-based algorithm. A constant, not a variable. |

1. Background Knowledge on DRAM and a Memory Controller 1.1 Relationship Between DRAM and a Memory Controller A processor and a memory are within a computer system. The memory controller exists in the processor and is connected to the memory and issues detailed instructions to the DRAM to process read and write memory requests from the processor.

FIG. 1 illustrates a structural diagram of a part in which the information of DRAM is stored. Capacitor cells are arranged in a checkerboard format, and wordlines and bitlines are used to access the capacitor cells.

Referring to FIG. 1, DRAM stores one bit of information in each of capacitor cells, and these cells are arranged in a checkerboard pattern to form rows and columns. Cells belonging to one row are all connected to the same wordline, and all cells of one column are connected to the same bitline. When the address value of a memory request from the memory controller is known, which row or column cell to access can be known through a decoder.

To read or write each cell, cell data are required to be buffered to a row buffer. To do this, first, the voltage of each of all bitlines is preset to about 0.5 Vdd, which is a median value between 0 (Ground; GND) and Vdd, through precharging, and the row buffer is invalidated. Then, through activation, a wordline of a row to which a cell having desired data belongs is connected to the bitline so that voltage of the cell can be reflected in the bitline. Through this process, 0 or 1 (Vdd) which is a desired cell datum is buffered to the row buffer in a unit of a row.

One thing to note is that when the value of a cell is buffered to the row buffer through precharge and activation, the voltage of the cell is clearly initialized to the original value of 0 or 1. This will be described in detail in 1.2. to be described later.

The size of row buffer is a page size (usually 8 Kb per device), and the size of row is also the page size. Since the unit of a memory request is a cache line (usually 64B), more data than necessary is buffered in the row buffer by one memory request. Accordingly, data required for the next consecutive memory request may already be buffered in the row buffer. In this case, the row buffer may be directly used without moving the data to the row buffer through precharge and activation.

Figure 2:
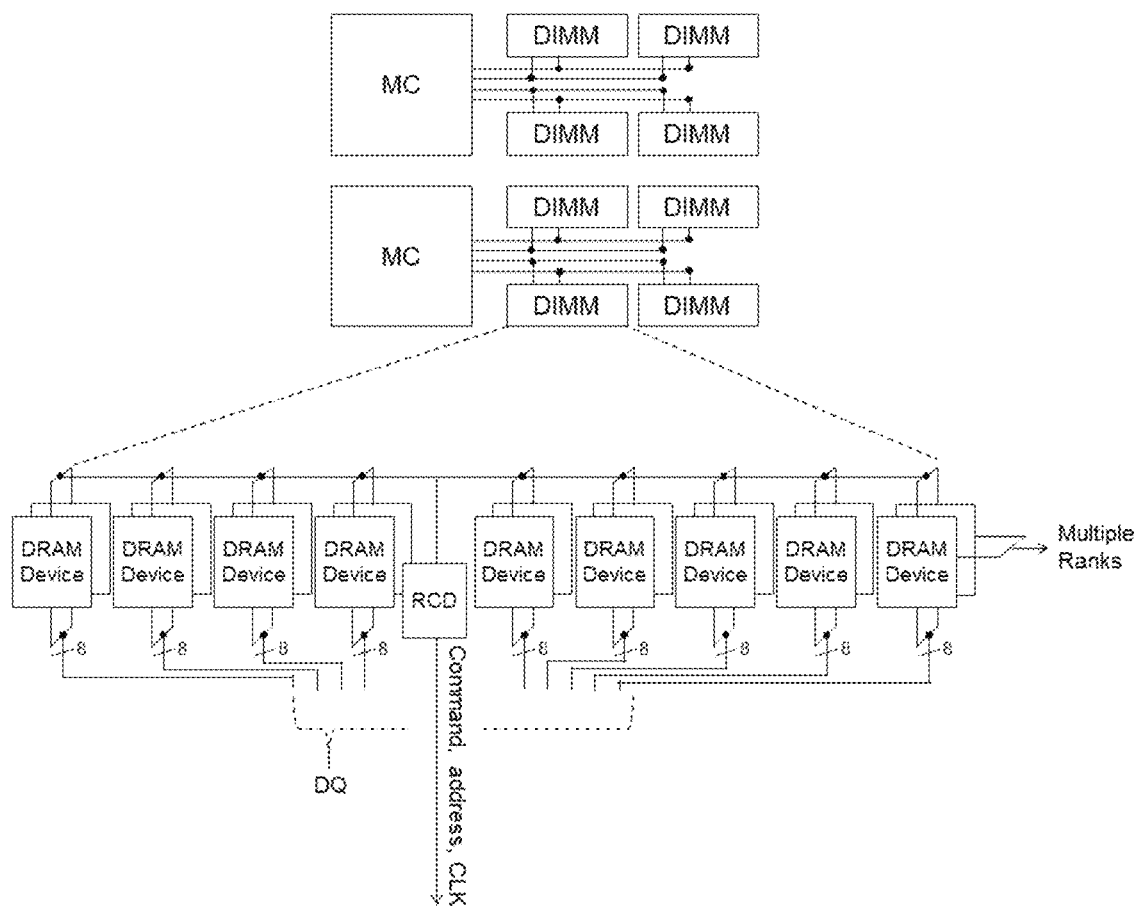
FIG. 2 is a structure diagram of the upper structure of a memory system.
Figure 3:
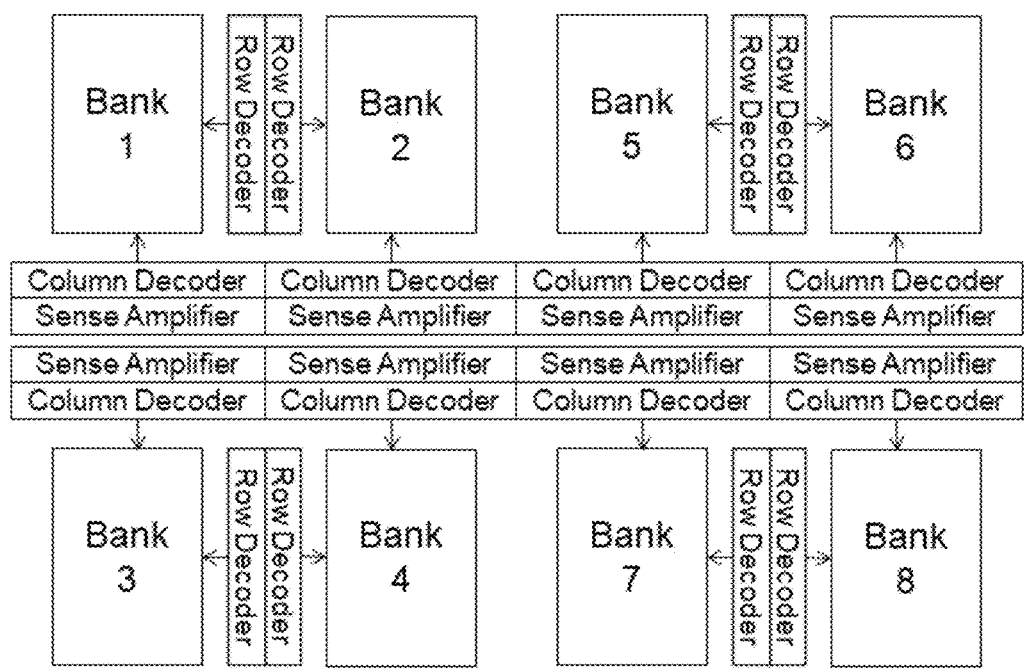
FIG. 3 is a structure diagram of a memory bank.

FIG. 2 is a structure diagram of the upper structure of a memory system, and FIG. 3 is a structure diagram of a memory bank.

Referring to FIG. 2, the memory system consists of one or more channels. One channel connects a memory controller with one or two dual in-line memory modules (DIMMs). One channel is composed of one or more ranks. One rank is composed of several banks, and each bank performs memory access independently of each other.

FIG. 3 shows that one rank is divided into multiple banks. For bandwidth and capacity, one rank consists of multiple DRAM chips (a DRAM device in FIG. 1) in the case of a DDRx interface using a form factor called DIMM. When N DRAM chips constitute one rank, each DRAM chip is responsible for 1/N of the total bandwidth and capacity on a rank. Meanwhile, in one bank, only one row buffer can be used at a specific moment, and one bank can buffer only one row at a time.

In order to better understand the operation of DRAM, the operation of the inside of the DRAM bank in each case will be described.

First, a situation in which the row buffer of the DRAM bank accessed by the memory address of the memory request is invalidated after precharge is considered. At this time, the voltage value of a row to which the desired cells belong is required to be buffered to the row buffer through the activation. Second, a situation in which the cell voltage value of the address accessed by the memory request is buffered in the row buffer is considered. In this case, the data of the row buffer may be directly read or written without separate precharge or activation. Third, a situation in which the information of a row which is not the address accessed by the memory request is buffered in the row buffer is considered. In this case, the row buffer is first invalidated through precharge to prepare the bitline, and then the data of a desired row is buffered in the row buffer through activation.

One thing to note here is that DRAM performs a passive role in relationship between the memory controller and DRAM.

While the memory controller knows a current row buffer state of the DRAM bank, and the operation state of the DRAM (precharge and activation), and so on, the memory controller can perform detailed operations such as precharge and activation with a precharge command and an active command.

This passive aspect of DRAM is connected to additional need for a refresh management interface in terms of time margin, which will be described later.

1.2 Description of DRAM Cell Retention Time and Refresh

The value of a DRAM cell is stored in a capacitor. As time passes, stored charges in the capacitor decrease due to leakage current, which causes decrease in a voltage, making it impossible to determine the value of the DRAM cell as "0" or "1". The operation of rewriting the value of the DRAM cell to 0 or 1 before the DRAM cell loses the value thereof is called refresh. In order to perform the refresh, as described in 1.1, when the values of cells of rows to be refreshed are buffered in the row buffer through precharge and activation operations, the values in the cells are also refreshed to 0 or 1. Accordingly, energy required for one refresh is energy required for "precharge and activation".

Time until the value of a DRAM cell is lost and cannot be read after being written as 0 or 1 is defined as "the retention time". Each cell of DRAM is required to be refreshed at least once before the retention time expires to ensure data integrity. To satisfy this, the memory controller periodically sends a refresh command to DRAM to refresh all cells little by little (normal refresh).

Specifically, the memory controller sends one refresh command every refresh interval time (tREFI) (3.9 microseconds in DDR5), and gives DRAM as much time as tRFC (295 nanoseconds in 16 Gb DDR5 device) each time, and it is guaranteed that the memory controller does not send any other command to a corresponding rank during this time. At this time, the DRAM uses this time to internally refresh multiple rows. The DRAM is required to ensure that refresh occurs at least once within the retention time of all cells by utilizing time for normal refresh periodically provided in this way.

For example, DDR4 in which the same retention time or tREFW exists for all cells will be described. In DDR4, tREFI is 7.8 us and the refresh window time tREFW is 64 ms, so the refresh command and the corresponding tRFC are sent to DRAM a total of 8192 times during tREFW. Since the total number of rows is 2 to the power of 17 on the basis of DDR4, in simple terms, the DRAM is required to refresh 16 rows for every normal refresh so that all cells can be refreshed at least once within tREFW or the retention time.

2. A Row Hammer Problem and a Prevention Technology Thereof 2.1. A Row Hammer Problem and Row Hammer Refresh (1) Definition of a Row Hammer (RH) Problem When a row (an aggressor row) is frequently activated, an unwanted effect may occur on physically adjacent rows (victim rows), resulting in bit flips (a phenomenon in which 0 becomes 1 or 1 becomes 0).

From the viewpoint of a victim row, when the number of times at which an adjacent aggressor row is activated without any refresh exceeds a predetermined threshold, a bit flip may occur. This threshold is defined as a row hammer threshold (Nth).

Although the rows are refreshed periodically through the normal refresh described in 1.2., a problem arises when too many activations occur between the normal refresh intervals. Since a normal refresh interval is relatively large for a specific DRAM row, a sufficiently large number of activations may occur when the row hammer threshold is sufficiently low.

(2) Definition of Row Hammer Refresh

Row hammer refresh is to refresh a victim row separately from normal refresh. Through this, the effect of row hammer that the victim row received until the row hammer refresh can be initialized.

Row hammer refresh is performed within a DRAM device, but the memory controller may request the DRAM device to perform row hammer refresh on a specific row, or the DRAM device may detect a risk on its own and perform row hammer refresh on a specific row.

The method in which the memory controller sends a specific command for row hammer refresh to the DRAM has been proposed only through research, and industries have not officially disclosed the method in which DRAM handles the row hammer on its own.

2.2. Row Hammer Prevention Scheme

The row hammer prevention scheme may be largely described in terms of how DRAM secures a time margin for performing the row hammer refresh, and how to determine when and where to perform the row hammer refresh within the secured time margin (defined as an algorithm).

When the row hammer prevention scheme works properly, it is possible to prevent a row hammer bit flip phenomenon from occurring.

2.3. Row Hammer Prevention Technology: Refresh Time Margin Stealing

To perform the row hammer refresh, a time margin is required.

Due to the passive nature of DRAM, the DRAM may receive other tasks from the memory controller while internally performing the row hammer refresh. In this case, the DRAM is required to stop the row hammer refresh and perform a task which the DRAM received from the memory controller.

Accordingly, from the standpoint of DRAM, it is necessary to secure a time margin to perform only the row hammer refresh without performing other work.

Normally, during refresh cycle time (tRFC) guaranteed through normal refresh, work to be done is performed faster, and row hammer refresh is performed during the remaining time. This is called "refresh time margin stealing".

A given time margin is tRFC for each tREFI, and at this time, the row hammer refresh should be performed in the remaining time while a normal refresh work is performed rapidly.

2.4. A Row Hammer Prevention Scheme Algorithm

In the case of performing row hammer prevention in the DRAM device, even if time margin is secured through stealing in common, it is not determined at what time and in which row (when and where) the row hammer refresh is performed.

Actually, determining when and where to perform the row hammer refresh is called a row hammer (RH) prevention scheme or row hammer (RH) prevention algorithm.

This may be divided into two types: a probabilistic RH prevention algorithm and a deterministic counter-based RH prevention algorithm.

The algorithm of the prevention scheme may be largely divided into a probabilistic method (Non-Patent Documents 1 to 3) and a counter-based method (Non-Patent Documents 4 to 7) according to the underlying philosophy.

The probabilistic method randomly selects a target according to a predetermined methodology and performs the row hammer refresh of the target. If the selection probability is properly set, the probabilistic method can guarantee safety with a very high probability. For example, the probability that a row hammer problem occurs even once in a corresponding DRAM device for one year can be guaranteed to be 1% or less.

In contrast, the counter-based method tracks the number of times at which aggressor rows are activated by using a counter table, through which deterministic safety for a specific Nth is mathematically guaranteed. Although there may be missing information when the number of counters is reduced, even considering the missing information, it can be mathematically guaranteed that the number of activations of the aggressor rows adjacent to the victim row does not exceed Nth.

CBT/CAT-TWO (Non-Patent Documents 6 and 7) first divides all DRAM rows into several groups forming a tree-type organization according to an activation pattern and assigns a counter to each of the groups. Counters that first reach a leaf (an end) during tree creation, or all counters in a case in which all available counters are used increase the counter of a group of a corresponding row when an activation (ACT) occurs in the certain row. When the value of the counter of the group reaches a specific value considered to be at the risk of row hammer, row hammer refresh is performed to refresh all rows of the corresponding group and two rows adjacent thereto. A tree created every preset reset time window is initialized, and the above-described process is repeated.

TWiCe (Non-Patent Document 4) has a counter table, and counts the number of activations by taking a specific row for each counter. In this case, when an activation command for a row that does not exist in the counter table comes in, the corresponding row is newly allocated to an entry with a counter value of 0. TWiCe initializes the values of the counter of a row which has been activated less frequently according to a predetermined threshold at regular intervals. During this operation, when a value of the counter reaches a specific value considered to be at risk of row hammer, the row hammer refresh is performed on the row belonging to the corresponding counter. The entire counter table is initialized at each preset reset time window, and the process described above is repeated.

Graphene also has a counter table, so each counter takes a specific row and counts the number of activations. In this case, there is one separate counter called a spillover counter, which always has a minimum value in the entire counter table. In this situation, when an address of an activated row exists in the table, a corresponding counter is incremented by 1. When the corresponding row does not exist in the table, the value of the spillover counter is compared with the counter values of the table. When there is a row with the same counter value, the corresponding row is replaced with a row in which activation occurred, and the corresponding counter is increased by 1, but when there is no row with the same counter value, the value of the spillover counter is increased by 1. When the value of the counter reaches a certain value that is regarded to be at risk of row hammer, the row hammer refresh is performed on a row belonging to the corresponding counter. The entire counter table is initialized at each preset reset time window, and the process described above is repeated.

3. A Deepened Row Hammer Problem and Introduction of the Refresh Management (RFM) Interface 3.1. Background of the Introduction of the Refresh Management (RFM) Interface As a DRAM fabrication process scales down, the row hammer problem has recently been intensified.

First, the row hammer threshold was lowered. When row hammer was first released (DDR3), the row hammer threshold has been reported to be lowered from around 139,000 to thousands in DDR4 recently.

In addition, previously, only an immediately adjacent aggressor row affected a victim row, but now more distant rows may also affect the victim row.

This situation causes a big problem in securing time margin among two items of the row hammer prevention scheme.

Time provided by normal refresh is limited to tRFC (295 ns) per tREFI (3.9 us on the basis of DDR5), and the amount of the time that can be stolen is also limited.

However, as vulnerability to row hammer increases, the row hammer refresh is required to be performed more often, and accordingly, more time margin is required. Accordingly, a situation in which the amount of a time margin that can be secured is insufficient has arrived.

To overcome this, the refresh management interface was newly introduced into DDR5 and LPDDR5.

The refresh management interface provides an additional time margin instead of insufficient refresh time margin stealing without damaging abstraction between the existing memory controller and DRAM and the passive nature of the DRAM.

When the memory controller periodically sends the refresh management command according to a simple standard, a time margin for the row hammer refresh is provided for a predetermined amount of time.

It is free which row hammer prevention scheme algorithm to use in DRAM (as in refresh time margin stealing).

3.2. A Specific RFM Interface

The definitions of tRFM, RAA (counter), and RAAIMT are as follows.

tRFM: a time margin given to DRAM for each refresh management command.
   RAA counter: a rolling accumulated ACT counter.
   RAAIMT: a rolling accumulated ACT (RAA) initial management threshold.

Figure 4:
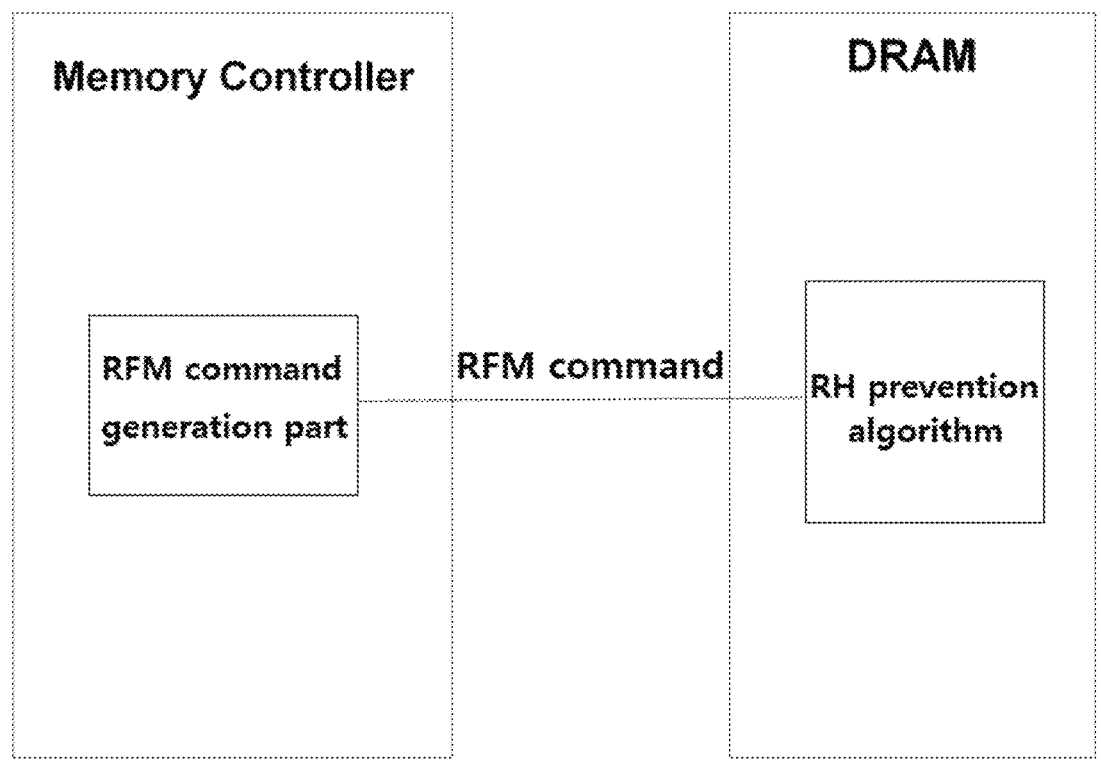
FIG. 4 is a high-level structure diagram of a row hammer prevention scheme on a refresh management interface face.

FIG. 4 is a high-level structure diagram of the row hammer prevention scheme on the refresh management interface face.

Referring to FIG. 4, in detail, a threshold for sending a refresh management command from the memory controller to a specific DRAM is whether the number of activations performed per DRAM bank (value of the rolling accumulated ACT counter) reaches the RAA initial management threshold, which is the reference value set by the DRAM device.

There is a rolling accumulated ACT counter that counts the number of activations for each bank inside the memory controller, and when any of the counters reaches the RAA initial management threshold, a refresh management command is sent to a corresponding bank, and the value of a corresponding rolling accumulated ACT counter decreases by the RAA initial management threshold.

Even at each normal refresh, the value of the rolling accumulated ACT counter is constantly reduced. Normal refresh time margin stealing appears to be presupposed, but is not specified and does not necessarily need to be introduced.

Accordingly, the DRAM device only sets the RAA initial management threshold once and informs the threshold to the memory controller, and on the basis of this, the memory controller periodically provides the refresh management command and a tRFM time margin, which is time for the DRAM to process the refresh management command, to the DRAM device while the memory controller is disconnected from the situation of the DRAM device.

Hereinafter, the exemplary embodiment of the present disclosure will be described in detail with reference to the accompanying drawings.

The problem of an existing row hammer prevention scheme in refresh management is that although a DRAM device can preset RAAIMT, the memory controller continuously sends the refresh management command without specific information about the situation of the row hammer prevention scheme in DRAM. When the row hammer refresh is performed each time at which the refresh management command is sent, additional energy is consumed. The selective row hammer refresh method of the present disclosure is intended to reduce the additional energy consumption.

When the row hammer refresh is performed by continuously utilizing a tRFM time margin given frequently regardless of the situation of the DRAM device, energy consumption may increase unnecessarily.

The selective row hammer refresh method according to the exemplary embodiment of the present disclosure is limited to a deterministic counter-based row hammer prevention algorithm, and a given tRFM time margin is used to perform the row hammer refresh only when the necessity of the row hammer refresh is great by considering the internal situation of the DRAM device. The counter indicated here refers to the counter of the deterministic counter-based row hammer prevention algorithm (a second counter) inside or near DRAM, not the rolling accumulated ACT counter (a first counter) inside the memory controller.

According to the embodiment of the present disclosure, although performance degradation due to the inability of a bank to perform general operations such as activation/precharge/reading/writing during tRFM cannot be changed by transmitting the refresh management command to the DRAM, unnecessary energy consumption can be prevented.

Figure 5:
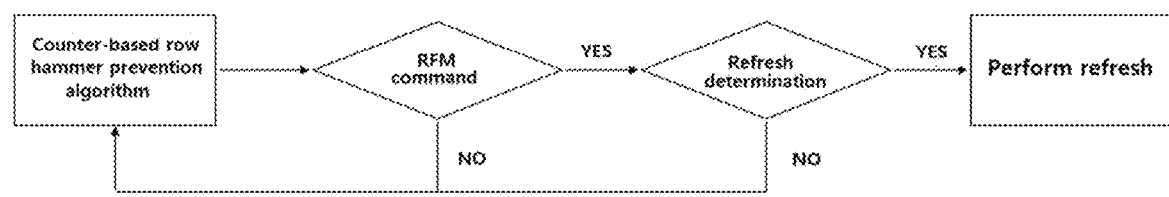
FIG. 5 is a conceptual flow chart of a selective row hammer refresh method according to an embodiment of the present disclosure.

FIG. 5 is a conceptual flow chart of the selective row hammer refresh method according to embodiment of the present disclosure.

Referring to FIG. 5, determining whether the necessity of the row hammer refresh is great is "refresh judgment".

A reason why it may be effective to utilize such a selective row hammer refresh is as follows.

1) When the number of row hammer refreshes is reduced in the row hammer prevention scheme, a great advantage can be obtained in terms of energy. This is because the row hammer refresh activates and precharges two DRAM rows and causes a significant portion of the energy consumption of most conceivable row hammer prevention schemes.

2) Compared to a case in which the selective row hammer refresh method of the present disclosure is applied, a row hammer prevention scheme without the application of the selective row hammer refresh method may perform row hammer refresh even in a situation in which the necessity of the row hammer refresh is low, resulting in low energy efficiency. On the other hand, a counter-based row hammer prevention scheme to which the selective row hammer refresh method of the present disclosure is applied may perform row hammer refresh only when the necessity of the row hammer refresh is great through judgment in each refresh management command, thereby maximizing energy efficiency.

3) The deterministic counter-based algorithm can prevent row hammers above a specific mathematically calculated Nth threshold. In this case, even if the selective row hammer refresh is applied, it can be effective because there are many cases in which the corresponding threshold is not significantly affected.

4) When the selective row hammer refresh is used, the effect of reducing energy consumption can be very large, especially in a normal workload (not a malicious program that attacks vulnerability to row hammers, but a general program running on a computer system).

The selective row hammer refresh method of the present disclosure is applicable to DRAM in which a refresh management interface is included later as well as to DDR5 and LPDDR5.

In addition, the selective row hammer refresh method of the present disclosure, which is a row hammer prevention scheme located in DRAM utilizing refresh management, may exist in a DRAM die or a register clock driver (RCD), and may exist in a logic die when the refresh management is introduced in HBM later.

Figure 6:
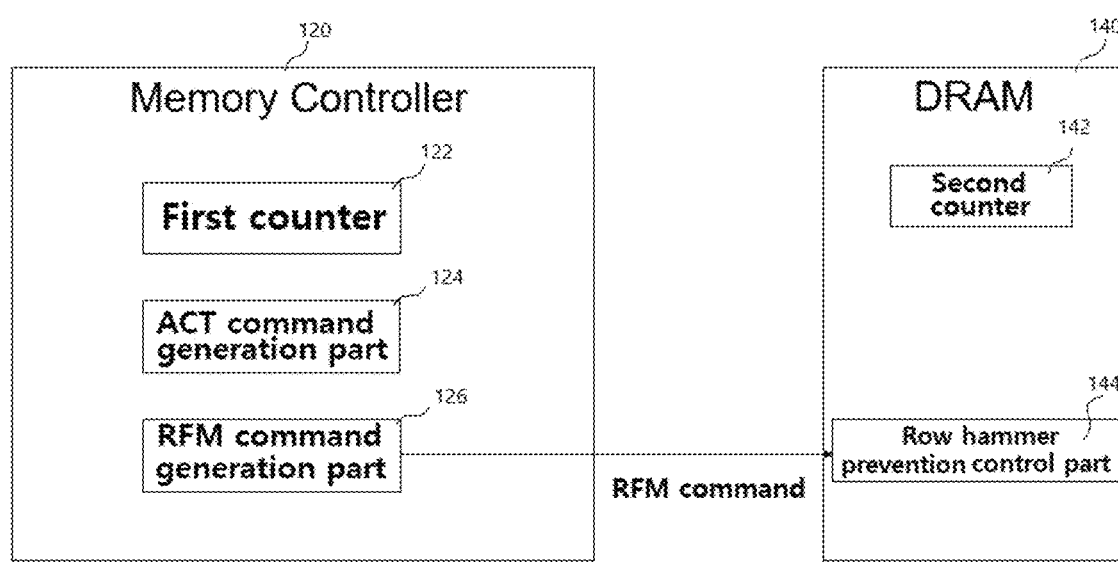
FIG. 6 is a detailed block diagram of the selective row hammer refresh apparatus of the present disclosure.

FIG. 6 is a detailed block diagram of the selective row hammer refresh apparatus of the present disclosure.

Referring to FIG. 6, the selective row hammer refresh apparatus 100 of the present disclosure includes the memory controller 120 and the DRAM 140.

The memory controller 120 includes a plurality of first counters 122, an ACT command generation part 124, and a refresh management command generation part 126.

The plurality of first counters 122 is issued per DRAM bank, subbank, or bundle of several DRAM banks (hereinafter, referred to as a DRAM bank).

The ACT command generation part 124 transmits the activation command (an ACT command), which causes a specific DRAM bank to activate, to DRAM.

The refresh management command generation part 126 increases a first counter value of the specific DRAM bank, which is activated, by 1, and when the first counter value reaches the RAA initial management threshold (RAAIMT) received previously from DRAM, sends the refresh management (RFM) command causing the performance of the row hammer refresh (RH refresh) in the corresponding DRAM bank to a row hammer prevention control part of the DRAM.

The DRAM 140 includes the second counter 142 and the row hammer prevention control part 144.

The second counter 142 exists in the DRAM and counts the number of activations (ACT) of the DRAM bank.

The second counter 142 may be located inside the DRAM 140, the register clock driver (RCD), or the logic die.

The row hammer prevention control part 144 performs the deterministic RH prevention algorithm, and when receiving the refresh management command, compares the value of the second counter 142 counting the number of activations (ACT) of the corresponding DRAM bank until the reception of the refresh management command with a preset reference value, wherein when the second counter value is smaller than the reference value, the row hammer refresh is not performed in the corresponding DRAM bank, but when the second counter value is greater than the reference value, row hammer refresh is performed in the corresponding DRAM bank, and then the value of the second counter of the row of the DRAM bank in which the row hammer refresh is performed is initialized to 0 or a specific value.

Figure 7:
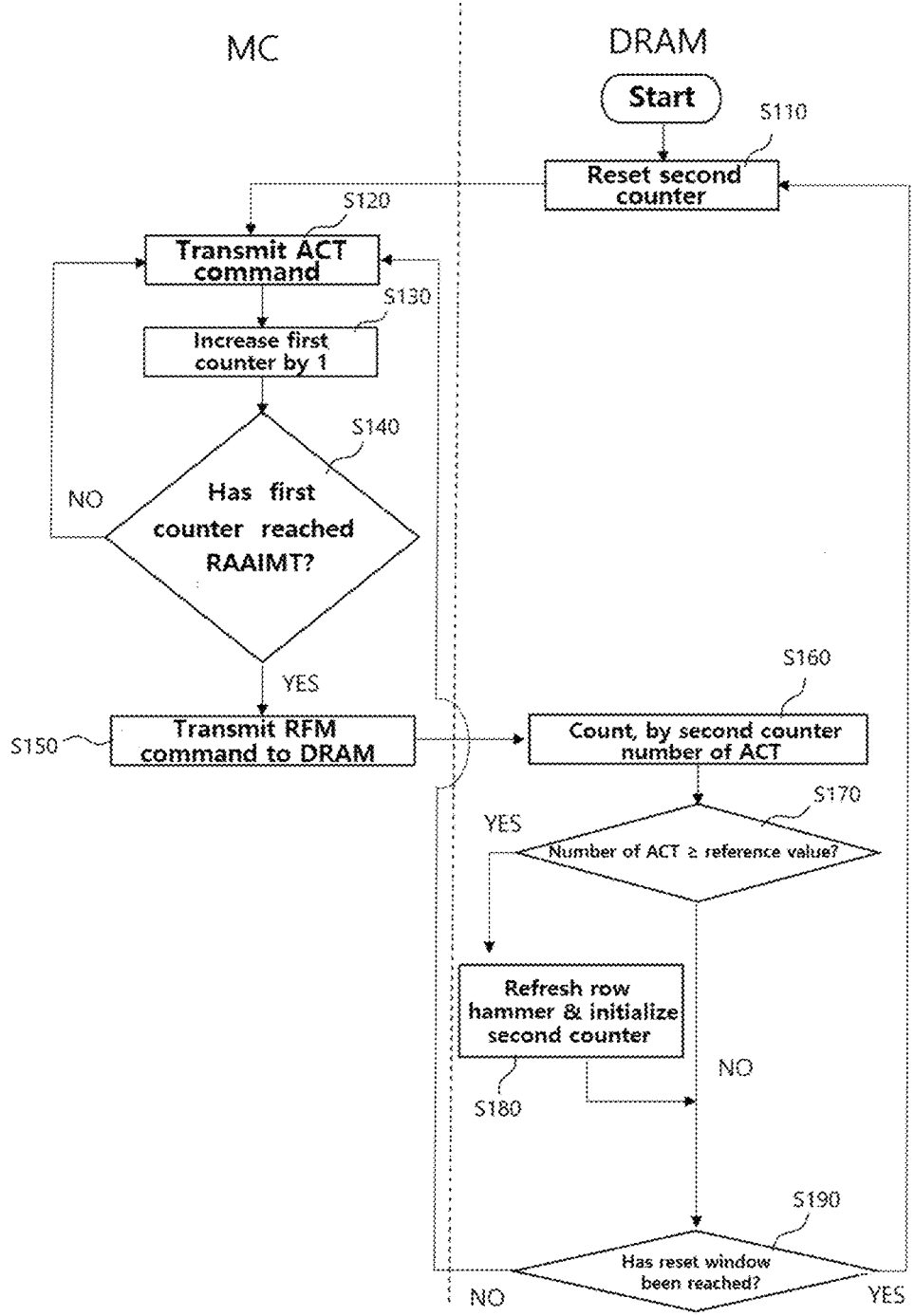
FIG. 7 is a detailed flow chart embodying the flow chart of the selective row hammer refresh method of the present disclosure in FIG. 5.

FIG. 7 is a flow chart embodying the flow chart of the selective row hammer refresh method of the present disclosure in FIG. 5.

Referring to FIG. 7, the selective row hammer refresh method of the present disclosure will be described in detail.

First, the memory controller 120 transmits an activation command (an ACT command), which causes a specific DRAM bank to activate, to the DRAM 140 at a step S120 and increases the value of the first counter of the specific DRAM bank by 1 among the plurality of first counters 122 issued per DRAM bank existing in the memory controller 120 at a step S130.

That is, each of the first counters 122 existing in the memory controller 120 individually counts the number of activations (ACT) of each DRAM bank.

Next, when the first counter value reaches the RAA initial management threshold (RAAIMT) previously received from the DRAM 140 at a step S140, the memory controller 120 sends an RFM command to perform row hammer refresh (RH refresh) in a corresponding DRAM bank to the row hammer prevention control part 144 of DRAM at a step S150.

Here, the row hammer prevention control part 144 of DRAM is based on the deterministic RH prevention algorithm. The deterministic RH prevention algorithm includes any one of TWiCe, Graphene, CBT, and CAT-TWO algorithms, or all other counter-based row hammer prevention algorithms.

Next, when receiving an RFM command, the row hammer prevention control part 144 of DRAM compares the value of the second counter 142 of DRAM which has counted the number of activations (ACT) of a corresponding DRAM bank with a preset reference value at steps S160 and S170.

Here, when the deterministic RH prevention algorithm is the Graphene algorithm, the reference value is preferably a relative value that is difference between a maximum value of values of the second counter and a value (a minimum value) of the spillover counter of each DRAM bank.

Next, at a result of the comparison DRAM by the row hammer prevention control part 144 at the step S170, when the second counter value is smaller than the reference value, the row hammer refresh is not performed in the corresponding DRAM bank, but when the second counter value is greater than the reference value, the row hammer refresh is performed in the corresponding DRAM bank, and then a value of a second counter 142 of a row of the DRAM bank in which the row hammer refresh is performed is initialized to 0 or a specific value at a step S180.

Specifically, when the row hammer refresh is performed, in the case of each of the TWiCe, CBT, and CAT-TWO, the second counter value of the row in which the row hammer refresh is performed is initialized to 0, and in the case of the Graphene, the value of the second counter 142 of the row in which the row hammer refresh is performed is initialized to the value of the spillover counter.

Next, the DRAM 140 determines whether reset window time according to the received refresh management (RFM) command has been reached at a step S190, and repeatedly performs the steps S120 to S190 if the reset window time has not been reached, and the second counter 142 is reset at a step S110 when the reset window time has been reached. Specifically, the reset of the second counter is to regenerate the counter tree of the second counter 142 in the case of the CAT-TWO algorithm and to reset the counter table of the second counter 142 in the case of the TWiCe and Graphene algorithms. After the reset, the steps S120 to S190 are repeatedly performed.

The selective row hammer refresh method according to embodiment of the present disclosure presets a selective row hammer refresh reference value in consideration of balance between the guarantee of a safe Nth and an energy reduction effect.

In addition, on the basis of this, when receiving a row hammer refresh command and performing row hammer refresh, when the value of the row hammer prevention algorithm counter of a target row, or difference between a minimum value between algorithm counters and the counter of the target row is less than the selective row hammer refresh reference value, row hammer refresh is not performed.

Hereinafter, with respect to the deterministic counter-based RH prevention algorithm to which the selective row hammer refresh method according to embodiment of the present disclosure is applied, an application example of the present disclosure for each algorithm type will be described in detail.

An Example of a Naive Counter-Based Algorithm

A counter mentioned here is the counter of the row hammer prevention algorithm [i.e., the second counter 142]

located in the DRAM, not the rolling accumulated ACT counter, unless otherwise noted.

Although it is impossible to realize a naive counter-based algorithm due to the overhead of the width of a DRAM die, a type of the most naive counter-based algorithm simply counts the number of activations for each row by placing one second counter 142 for every row.

When the row hammer refresh is performed on the row of a counter with the largest value of the second counter whenever the refresh management command is received, safety can be guaranteed for a mathematically constant Nth. At this time, when the row hammer refresh is performed, the value of the corresponding second counter is initialized to 0.

In this situation, the reference value of the selective row hammer algorithm of the present disclosure can be freely preset at any time. At this time, 1) the impact of the safe Nth guaranteed in the counter-based algorithm and 2) an energy reduction effect in a normal workload are required to be checked to find a balanced "optimized" value between the two.

(1) Safe Nth

The deterministic counter-based algorithm guarantees a mathematically safe Nth that can be calculated according to the configuration of the algorithm.

1) In the absence of the selective row hammer refresh, the safe Nth is expressed as a function $Function_{SafeNth}$ that takes two variables as an input (the number #ofTableEntry, RAAIMT of the counter of counter-based algorithm. In this case, #ofTableEntry in the naive counter-based algorithm means algorithm configuration).

$$Function_{SafeNth}(RAAIMT, \#ofTableEntry) \quad \text{[Equation 1]}$$

2) In the presence of the selective row hammer refresh, the safe Nth is expressed as a function $Function'_{SafeNth}$ that takes three variables as an input [(#ofTableEntry, RAAIMT, a selective row hammer refresh threshold (SelectiveParam)].

$$Function'_{SafeNth}(RAAIMT, \#ofTableEntry, Selective\text{-}Param) \quad \text{[Equation 2]}$$

As the value of SelectiveParam increases, the value of $Function'_{SafeNth}$ increases more than the existing value of $Function_{SafeNth}$, and accordingly, from the point of view of the safe Nth, using the selective row hammer refresh has a negative effect.

(2) Energy Reduction Effect

The introduction of the selective row hammer refresh may have an adverse effect of slightly increasing the value of the safe Nth, but at the same time, will reduce energy consumption.

Depending on a workload, there may be cases in which the effect of reducing energy consumption is large even when a small reference value of the selective row hammer refresh that can have a small effect on the safe Nth is established.

When memory access is performed uniformly across multiple addresses, because the value of the second counter 142 having the largest counter value is reduced to a minimum value in the entire counter table at corresponding time at each refresh management command, the counter values of the counter-based algorithm at any time point can be maintained more or less uniform.

Accordingly, when a selective row hammer refresh reference value is preset as a value that exceeds this uniformity, the row hammer refresh is not performed at most refresh management commands, so the effect of reducing energy consumption can be large.

(3) Summary

In summary, the reference value of the selective row hammer refresh is required to be preset as an optimal value obtained by comprehensively determining how much the reference value affects the safe Nth and how much energy can be reduced in a workload.

Application Example of Selective Row Hammer Refresh in CBT/CAT-TWO, TWiCe, and Graphene From here, instead of the naive counter-based algorithm, which has poor feasibility, the application of the refresh management interface and the selective row hammer refresh to counter-based algorithms announced in real academia will be described.

(1) CAT-TWO to which the Refresh Management Interface is Applied

Figure 8:
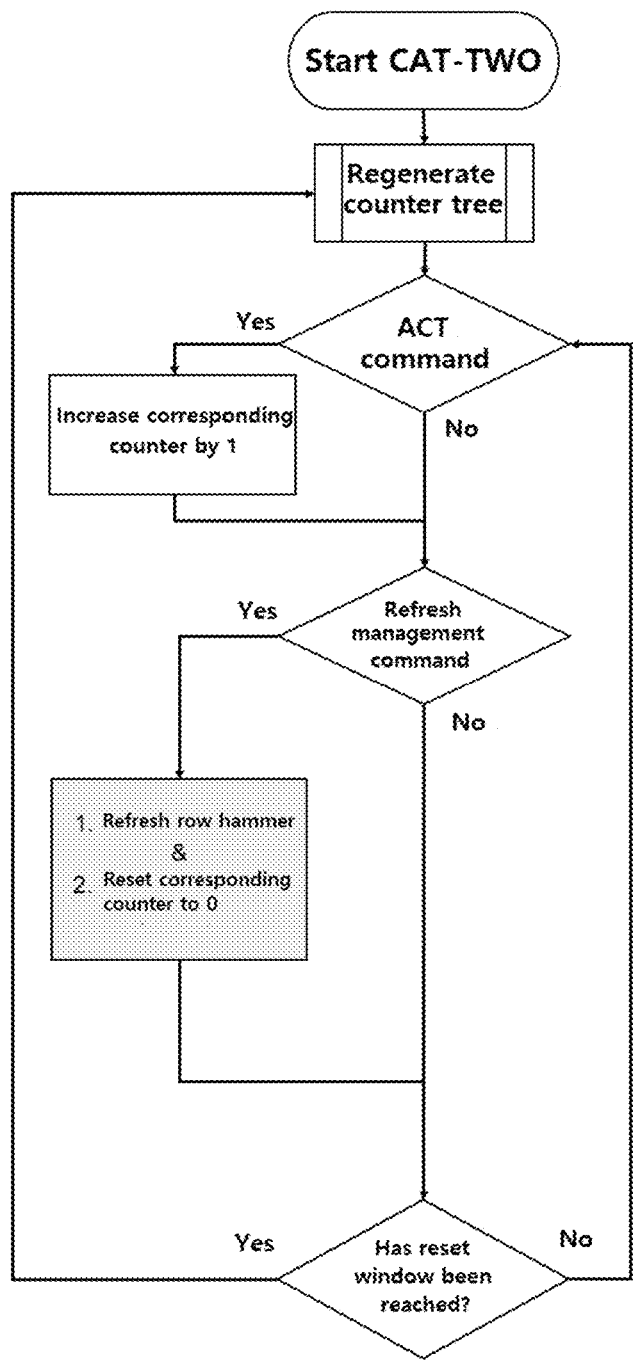
FIG. 8 is a flow chart in which the selective row hammer refresh method is not applied to CAT-TWO.
Figure 9:
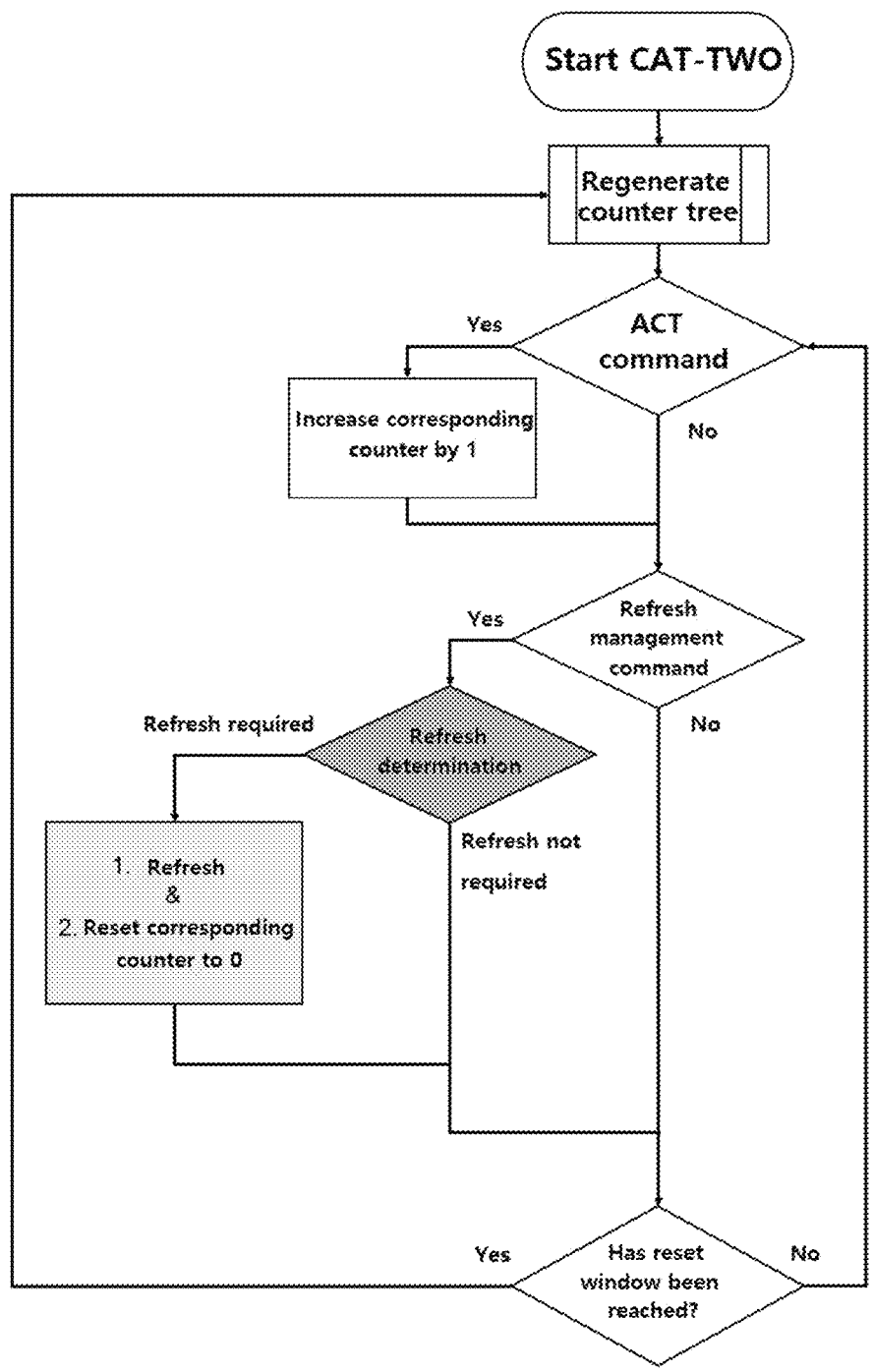
FIG. 9 is a flow chart in which the selective row hammer refresh method of the present disclosure is applied to CAT-TWO.

FIG. 8 is a flow chart in which the selective row hammer refresh method is not applied to CAT-TWO, and FIG. 9 is a flow chart in which the selective row hammer refresh method of the present disclosure is applied to CAT-TWO.

Referring to FIGS. 8 and 9, in CAT-TWO (described in 2.4.), whenever the refresh command is received, row hammer refresh is illustrated to be performed on a counter having the largest value in counters reaching a leaf among all counters. In this example, after performing refresh according to the RFM command, the value of the corresponding second counter 142 may be initialized to 0.

In this case, when the selective row hammer refresh method is not applied, row hammer refresh is performed even if the value of the second counter 142 is small, that is, even if the necessity of the refresh is low. On the other hand, when the selective row hammer refresh method is applied, the row hammer refresh is actually performed only when the value of the second counter 142 of CAT-TWO is large, that is, only when the necessity of the refresh is great.

Safe Nth in CAT-TWO receives three variables in the same manner as the naive counter-based algorithm. In this case, a value previously expressed as #ofTableEntry has been replaced with a CAT-TWO configuration value as shown in Equation 3 below. This is because, unlike the naive counter-based algorithm, there are various configuration values in addition to the number of counters.

$$Function'_{SafeNth}(RAAIMT, CAT\text{-}TWO\ configuration, SelectiveParam) \quad \text{[Equation 3]}$$

(2) TWiCe/Graphene to which the Refresh Management Interface is Applied

Figure 10:
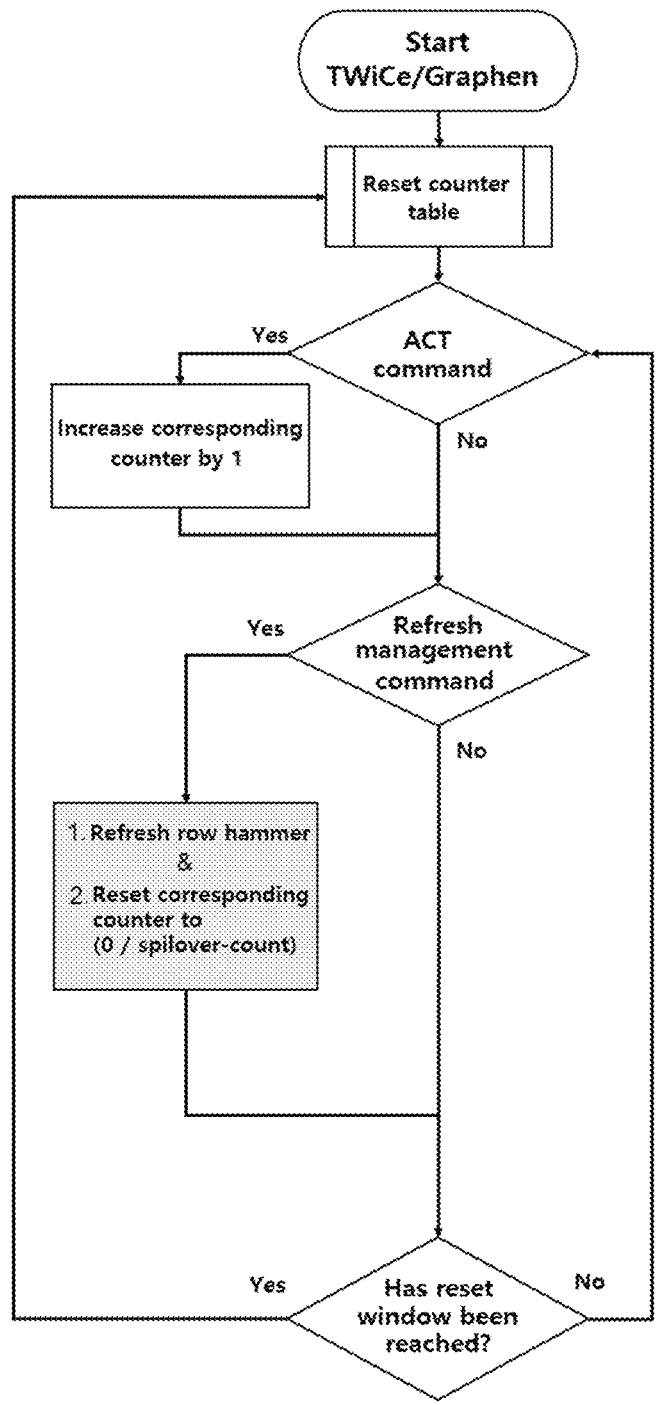
FIG. 10 is a flow chart in which the selective row hammer refresh method is not applied to Graphene and TWiCe.
Figure 11:
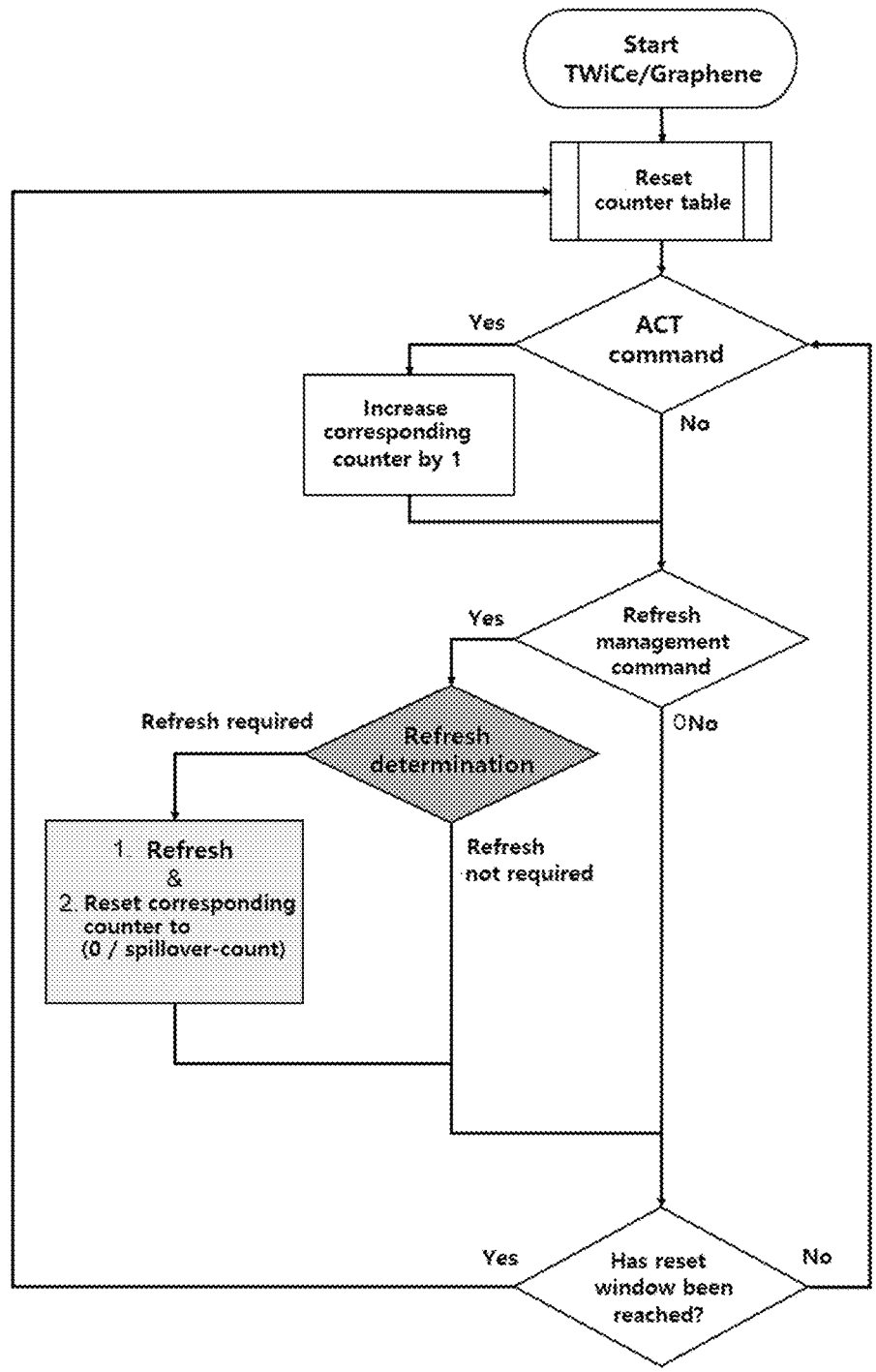
FIG. 11 is a flow chart in which the selective row hammer refresh method of the present disclosure is applied to Graphene and TWiCe.

FIG. 10 is a flow chart in which the selective row hammer refresh method is not applied to Graphene and TWiCe, and FIG. 11 is a flow chart in which the selective row hammer refresh method of the present disclosure is applied to Graphene and TWiCe.

Referring to FIGS. 10 and 11, it may be considered as an example that Graphene or TWiCe performs row hammer refresh for a counter having the largest value among all counters whenever receiving the refresh management command. In this example, after the row hammer refresh is performed according to the refresh management command, in the case of Graphene, the value of the second counter 142, which is the target of the row hammer refresh, may be initialized to the value of the spillover counter, and in the case of TWiCe, the value of the second counter 142, which is the target of the row hammer refresh, may be initialized to 0.

Although the values of the second counter in Graphene and TWiCe may not exactly match, the values of the second counter 142 in Graphene and TWiCe are proportional to the number of activations performed in a corresponding row. That is, when the value of the second counter 142 is small, there is little activation in the corresponding row, but when the value is large, there is a high possibility that the corresponding row is frequently activated. Specifically, a relationship between the value of the second counter 142 and the number of activations is mathematically defined in a different way in each of Graphene and TWiCe, but the proportional relationship is maintained in both Graphene and TWiCe.

Accordingly, even in this example, when the value of the second counter 142 is small, the need for row hammer refresh is small.

Accordingly, when the selective row hammer refresh is applied, the row hammer prevention control part 144 compares the value of the second counter 142 and a preset reference value (a selective row hammer refresh reference value) at each refresh management command, and determines whether to perform the row hammer refresh.

In the case of TWiCe, the reference value and the value of the second counter 142 are directly compared with each other.

In the case of Graphene, the reference value and the value of (the second counter value−the spillover counter value) are compared with each other.

The safe Nth of each of TWiCe and Graphene receives three variables in the same manner as the naive counter-based algorithm, CBT, or CAT-TWO. In this case, value previously expressed as #ofTableEntry has been replaced with TWiCe configuration and Graphene configuration because unlike the naive counter-based algorithm, there are various setting values in addition to the number of counters.

Equation 4 below is the safe Nth of TWiCe, and Equation 5 is the safe Nth of Graphene.

$$\text{Function}'_{SafeNth}(\text{RAAIMT,TWiCe configuration,SelectivePara}) \qquad \text{[Equation 4]}$$

$$\text{Function}'_{SafeNth}(\text{RAAIMT,Graphene configuration, SelectiveParam}) \qquad \text{[Equation 5]}$$

Although the embodiment of the present disclosure has been described with reference to the accompanying drawings, those skilled in the art will understand that the embodiment can be implemented in other specific forms without changing its technical spirit or essential features. Therefore, it should be understood that the embodiment described above is illustrative in all respects and not restrictive.

The invention claimed is:

1. A counter-based selective row hammer refresh apparatus for row hammer prevention, the apparatus comprising:
   a memory controller comprising a plurality of first counters issued per DRAM bank, subbank, or bundle of multiple DRAM banks (hereinafter, referred to as a DRAM bank), an ACT command generation part configured to transmit an activation (ACT) command, which causes a specific DRAM bank to activate, to a DRAM, and a refresh management command generation part which increases a first counter value of the specific DRAM bank, which is activated, by 1, and sends a refresh management (RFM) command causing performance of row hammer refresh (RH refresh) in the DRAM bank to a row hammer prevention control part of the DRAM when the first counter value reaches an RAA initial management threshold (RAAIMT) received previously from the DRAM; and
   the DRAM comprising a second counter which is present in the DRAM and counts a number of activations (ACT) of the DRAM bank, and the row hammer prevention control part which performs a deterministic RH prevention algorithm and when receiving the refresh management command, compares a value of the second counter counting the number of activations (ACT) of the DRAM bank until the reception of the refresh management command with a preset reference value, wherein when the second counter value is smaller than the reference value, the row hammer refresh is not performed in the DRAM bank, but when the second counter value is greater than the reference value, the row hammer refresh is performed in the DRAM bank, and then a value of the second counter of a row of the DRAM bank in which the row hammer refresh is performed is initialized to 0 or a specific value.

2. The apparatus of claim 1, wherein the second counter is located in the DRAM, a register clock driver (RCD), or a logic die.

3. A counter-based selective row hammer refresh method for row hammer prevention, the method comprising:
   (a) a step at which a memory controller transmits an activation (ACT) command causing performance of activation of a specific DRAM bank to a DRAM and increases a value of a first counter of the specific DRAM bank by 1 among a plurality of first counters issued per DRAM bank, subbank, or bundle of multiple DRAM banks (hereinafter, referred to as a DRAM bank) present in the memory controller;
   (b) a step at which the memory controller sends a refresh management (RFM) command causing performance of row hammer refresh (RH refresh) in the DRAM bank to a row hammer prevention control part of the DRAM performing a deterministic RH prevention algorithm when the first counter value reaches an RAA initial management threshold (RAAIMT) received previously from the DRAM;
   (c) a step at which when receiving the refresh management command, the row hammer prevention control part of the DRAM compares a value of a second counter of the DRAM counting a number of activations of the DRAM bank until the reception of the refresh management command with a preset reference value; and
   (d) a step at which as a result of the comparison by the row hammer prevention control part of the DRAM at the step (c), when the second counter value is smaller than the reference value, the row hammer refresh is not performed in the DRAM bank, but when the second counter value is greater than the reference value, the row hammer refresh is performed in the DRAM bank, and then a value of the second counter of a row of the DRAM bank in which the row hammer refresh is performed is initialized to 0 or a specific value.

4. The method of claim 3, wherein the deterministic RH prevention algorithm, which is a counter-based row hammer prevention algorithm, comprises TWiCe, Graphene, CBT, and CAT-TWO algorithms.

5. The method of claim 4, wherein when the row hammer refresh is performed at the step (d), in a case of each of the TWiCe, CBT, and CAT-TWO, the value of the second counter of the row in which the row hammer refresh is performed is initialized to 0, and in a case of the Graphene, the value of the second counter of the row in which the row hammer refresh is performed is initialized to a value of a spillover counter.

6. The method of claim 4, wherein when the deterministic RH prevention algorithm is the Graphene algorithm, the reference value is a relative value that is a difference between a maximum value of second counter values and a spillover counter value (a minimum value) of each DRAM bank.

* * * * *